(12) United States Patent
Silberberg et al.

(10) Patent No.: US 12,054,821 B2
(45) Date of Patent: Aug. 6, 2024

(54) VACUUM DEPOSITION FACILITY AND METHOD FOR COATING A SUBSTRATE

(71) Applicant: ArcelorMittal, Luxembourg (LU)

(72) Inventors: Eric Silberberg, Haltinne (BE); Bruno Schmitz, Nandrin (BE); Sergio Pace, Jodoigne (BE); Remy Bonnemann, Saint-Nicolas (BE); Didier Marneffe, Engis (BE)

(73) Assignee: ArcelorMittal, Luxembourg (LU)

( * ) Notice: Subject to any disclaimer, the term of this patent is extended or adjusted under 35 U.S.C. 154(b) by 706 days.

(21) Appl. No.: 16/770,850

(22) PCT Filed: Dec. 11, 2018

(86) PCT No.: PCT/IB2018/059856
§ 371 (c)(1),
(2) Date: Jun. 8, 2020

(87) PCT Pub. No.: WO2019/116214
PCT Pub. Date: Jun. 20, 2019

(65) Prior Publication Data
US 2021/0164088 A1  Jun. 3, 2021

(30) Foreign Application Priority Data

Dec. 14, 2017  (WO) .................. PCT/IB2017/057943

(51) Int. Cl.
C23C 14/56 (2006.01)
C23C 14/14 (2006.01)
C23C 14/24 (2006.01)

(52) U.S. Cl.
CPC .............. *C23C 14/24* (2013.01); *C23C 14/14* (2013.01); *C23C 14/562* (2013.01); *C23C 14/564* (2013.01)

(58) Field of Classification Search
CPC ........ C23C 14/24; C23C 14/562; C23C 14/56
See application file for complete search history.

(56) References Cited

U.S. PATENT DOCUMENTS

2002/0142095 A1  10/2002  Motoyama et al.
2002/0182845 A1  12/2002  Miyano et al.
(Continued)

FOREIGN PATENT DOCUMENTS

CN  101608301 A  12/2009
CN  103732792 A   4/2014
(Continued)

OTHER PUBLICATIONS

International Search Report of PCT/IB2018/059856, of Mar. 7, 2019.

*Primary Examiner* — Aiden Lee
(74) *Attorney, Agent, or Firm* — Davidson Kappel LLC

(57) ABSTRACT

A vacuum deposition facility for continuously depositing, on a running substrate, coatings formed from metal or metal alloy, the facility including—a vacuum chamber and a device for running the substrate through the vacuum chamber along a given path, wherein the vacuum chamber further includes:
a central casing including a substrate entry and a substrate exit located on two opposite sides of the central casing and a vapor jet coater, the inner walls of the central casing being suited to be heated at a temperature above the condensation temperature of the metal or metal alloy vapors,
a vapor trap in the form of an external casing located at the substrate exit of the central casing, the inner walls of the vapor trap being suited to be maintained at a temperature below the condensation temperature of the metal or metal alloy vapors.

33 Claims, 1 Drawing Sheet

(56) References Cited

U.S. PATENT DOCUMENTS

| | | |
|---|---|---|
| 2007/0218201 A1 | 9/2007 | Gottsman et al. |
| 2007/0240636 A1 | 10/2007 | Gottsman et al. |
| 2008/0072822 A1* | 3/2008 | White ................. C23C 16/4412 |
| | | 96/108 |
| 2008/0213477 A1 | 9/2008 | Zindel et al. |
| 2008/0280066 A1 | 11/2008 | Schade von Westrum et al. |
| 2010/0275848 A1* | 11/2010 | Fukuda ................... C30B 29/36 |
| | | 118/728 |
| 2011/0142746 A1 | 6/2011 | Reed et al. |
| 2012/0034733 A1* | 2/2012 | Sferlazzo .............. C23C 14/562 |
| | | 438/95 |
| 2012/0291708 A1 | 11/2012 | Bak et al. |
| 2014/0178567 A1 | 6/2014 | Lyons et al. |
| 2016/0222495 A1 | 8/2016 | Chaleix et al. |
| 2018/0258521 A1 | 9/2018 | Inoue et al. |

FOREIGN PATENT DOCUMENTS

| | | |
|---|---|---|
| CN | 106198125 A | 12/2016 |
| EP | 2562288 A2 | 2/2013 |
| JP | 2002359241 A | 12/2002 |
| JP | 2007534843 A | 11/2007 |
| JP | 2002294456 A | 10/2020 |
| KR | 20070011542 A | 1/2007 |
| KR | 101010196 B1 | 1/2011 |
| KR | 101184679 B1 | 9/2012 |
| RU | 2388846 C2 | 5/2010 |
| RU | 2471015 C2 | 12/2012 |
| WO | WO97/47782 | 12/1997 |
| WO | WO03012161 A1 | 2/2003 |
| WO | WO2007054229 A1 | 5/2007 |
| WO | WO2017051790 A1 | 3/2017 |
| WO | WO-2019239185 A1 * | 12/2019 ............. C23C 14/04 |

* cited by examiner

VACUUM DEPOSITION FACILITY AND METHOD FOR COATING A SUBSTRATE

The present invention relates to a vacuum deposition facility for depositing, on a substrate, coatings formed from metal or metal alloys such as for example zinc and zinc-magnesium alloys, said facility being more particularly intended for coating steel strip, without being limited thereto. The present invention also relates to the method for coating a substrate thereof.

BACKGROUND

Various processes for depositing metal coatings, eventually composed of alloys, on a substrate, such as a steel strip, are known. Among these, mention may be made of hot-dip coating, electrodeposition and also the various vacuum deposition processes, such as vacuum evaporation and magnetron sputtering.

It is known from WO97/47782 a method for the continuous coating of a steel substrate in which a metallic vapor spray, propelled at a speed greater than 500 m/s, comes in contact with the substrate. To improve the efficiency of this method, the corresponding vacuum deposition facility comprises a deposition chamber which inner walls are suited to be heated at a temperature high enough to avoid condensation of metal or metal alloys vapors on them.

Nevertheless, it has been observed that zinc vapors tend to exit the deposition chamber and to condensate outside of the deposition chamber in the vacuum deposition facility, which significantly reduces the deposition yield and makes the cleaning of the vacuum deposition facility complicated.

SUMMARY OF THE INVENTION

An aim of the present invention is to remedy the drawbacks of the facilities and processes of the prior art by providing a vacuum deposition facility that prevents condensation of metal or metal alloys vapors outside of the deposition chamber.

The present invention provides a vacuum deposition facility for continuously depositing, on a running substrate, coatings formed from metal or metal alloy, the facility comprising a vacuum chamber through which the substrate can run along a given path, wherein the vacuum chamber further comprises:
- a central casing comprising a substrate entry and a substrate exit located on two opposite sides of the central casing and a vapor jet coater, the inner walls of the central casing being suited to be heated at a temperature above the condensation temperature of the metal or metal alloy vapors,
- a vapor trap in the form of an external casing located at the substrate exit of the central casing, comprising an inward opening adjacent to the central casing and an outward opening located at the opposite side of the vapor trap, the inner walls of the vapor trap being suited to be maintained at a temperature below the condensation temperature of the metal or metal alloy vapors.

The facility according to the invention may also have the optional features listed below, considered individually or in combination:
the vacuum deposition facility further comprises a second vapor trap located at the substrate entry of the central casing,
the length of the vapor trap in the running direction is comprised between 0.5 time and 3.5 times the substrate width,
the walls of the vapor trap around the inward opening are perpendicular to the substrate path,
the lower and upper walls of the vapor trap are converging outwards,
the vapor trap has, in longitudinal cross-section, a trapezoid shape pointing in a direction opposite to the central casing,
the inner walls of the vapor trap are removable,
the heat regulation of the vapor trap is a cooling circuit supplied with a heat transfer fluid selected among water and nitrogen.

The present invention also provides a process for continuously depositing, on a running substrate, coatings formed from metal or metal alloy, wherein the process comprises:
A first step in which metallic vapor is ejected towards at least one side of the running substrate and a first layer of metal or metal alloy is formed on said side by condensation of a first part of the ejected vapor, this first step taking place in a central casing comprising a substrate entry and a substrate exit located on two opposite sides of the central casing and inner walls heated at a temperature above the condensation temperature of the metal or metal alloy vapors,
A second step in which a second layer of metal or metal alloy is formed on said side by condensation of a second part of the ejected vapor, this second step taking place in a vapor trap in the form of an external casing located at the substrate exit of the central casing and comprising inner walls maintained at a temperature below the condensation temperature of the metal or metal alloy vapors.

The second step of the process according to the invention may optionally further take place in a second vapor trap located at the substrate entry of the central casing.

The present invention also provides a kit for the assembling of a vacuum deposition facility for continuously depositing, on a running substrate, coatings formed from metal or metal alloy, the kit comprising:
a central casing comprising a substrate entry and a substrate exit located on two opposite sides of the central casing and the vapor outlet orifice of a vapor jet coater, the inner walls of the central casing being suited to be heated at a temperature above the condensation temperature of the metal or metal alloy vapors,
a vapor trap in the form of an external casing suited to be located at the substrate exit of the central casing, comprising an inward opening adjacent to the central casing and an outward opening located at the opposite side of the vapor trap, the inner walls of the vapor trap being suited to be maintained at a temperature below the condensation temperature of the metal or metal alloy vapors.

As it will be explained, the invention is based on the addition of a vapor trap at the exit of the central casing so that the vapors exiting the central casing condensate both on the substrate and on the inner walls of the vapor trap which, on one hand, increases the deposition yield and which, on the other hand, suppress the condensation of vapors on the walls of the vacuum chamber.

Other characteristics and advantages of the invention will be described in greater detail in the following description.

BRIEF DESCRIPTION OF THE DRAWINGS

The invention will be better understood by reading the following description, which is provided purely for purposes of explanation and is in no way intended to be restrictive, with reference to.

DETAILED DESCRIPTION

An aim of the present invention is to deposit, on a substrate, coatings formed from metal or metal alloys. The aim is in particular to obtain zinc or zinc-magnesium coatings. However, the process is not limited to these coatings, but preferably encompasses any coating based on one single metal or on a metal alloy whose elements have vapor pressures at the bath temperature not differing by more than 10%, as controlling their respective relative content is then facilitated.

To give an indication, mention may thus be made of coatings made of zinc, as main element, and additional element(s), such as chromium, nickel, titanium, manganese, magnesium, silicium and aluminum, considered individually or in combination.

The thickness of the coating will preferably be between 0.1 and 20 μm. On one hand, below 0.1 μm, there would be a risk that the corrosion protection of the substrate would be insufficient. On the other hand, it is unnecessary to go beyond 20 μm in order to have the level of corrosion resistance which is required, in particular, in the automotive or construction field. In general, the thickness may be limited to 10 μm for automotive applications.

Figure 1:
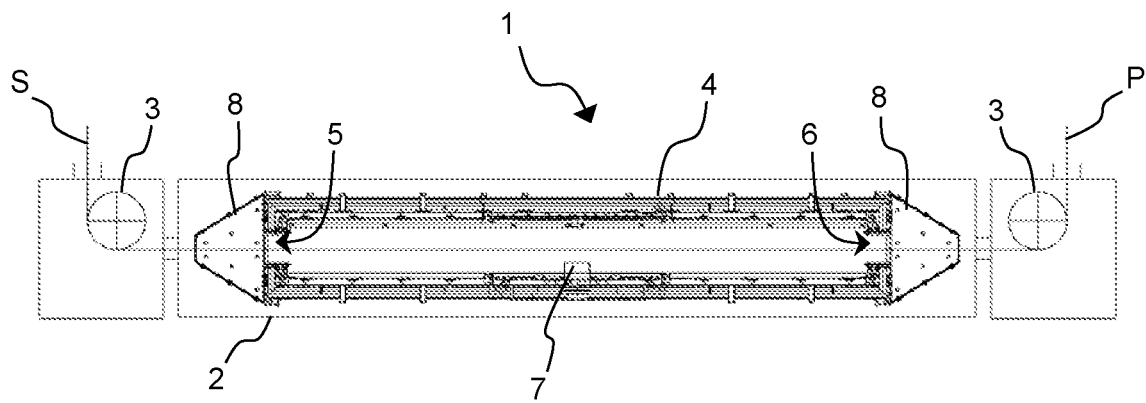
FIG. 1, which is a cross-section of an embodiment of a facility according to the invention.

With reference to FIG. 1, the facility 1 according to the invention first comprises a vacuum chamber 2 and a means for running the substrate through the chamber.

This vacuum chamber 2 is a hermetically-sealable box preferably kept at a pressure of between $10^{-8}$ and $10^{-3}$ bar. It has an entry lock and an exit lock (these not being shown) between which a substrate S, such as for example a steel strip, can run along a given path P in a running direction.

The substrate S may be made to run by any suitable means, depending on the nature and the shape of said substrate. A rotary support roller 3 on which a steel strip can bear may in particular be used.

The vacuum chamber 2 comprises a central casing 4. This is a box surrounding the substrate path P on a given length in the running direction, typically 2 to 8 m long. Its walls delimit a cavity. It comprises two apertures, i.e. a substrate entry 5 and a substrate exit 6 located on two opposite sides of the central casing. Preferably the central casing is a parallelepiped which width is slightly larger than the substrates to be coated.

The walls of the central casing are suited to be heated. The heating may be made by any suitable means, such as for example an induction heater, heating resistors, or electron beam. The heating means are suited to heat the inner walls of the central casing at a temperature high enough to avoid condensation of metal or metal alloy vapors on them.

Preferably, the walls of the central casing are suited to be heated above the condensation temperatures of the metal elements forming the coating to be deposited, typically above 500° C., for example between 500° C. and 700° C. so as to avoid the condensation of zinc vapors or zinc-magnesium alloy vapors. Thanks to these heating means, the inner walls of the central casing do not become clogged and the facility does not have to be frequently stopped for cleaning.

Figure 2:
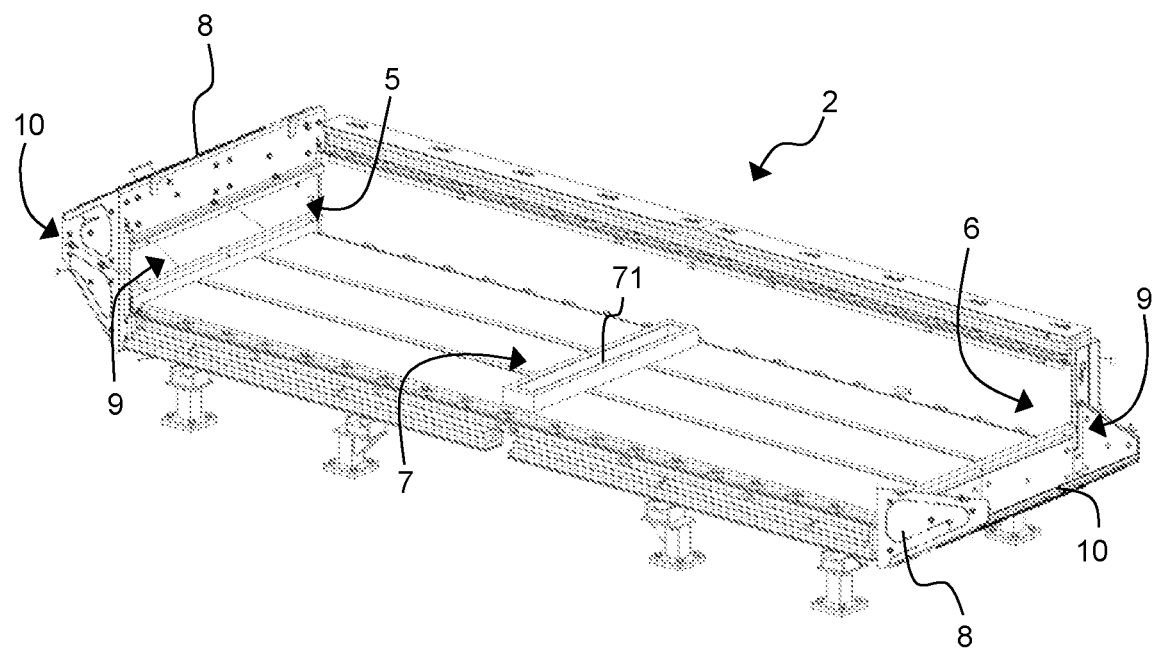
FIG. 2, which is a cutaway view of an embodiment of the vacuum chamber according to the invention It should be noted that the terms "lower", "beneath", "inward", "inwards", "outward", "outwards", "upstream", "downstream", . . . as used in this application refer to the positions and orientations of the different constituent elements of the facility when the latter is installed on a vacuum deposition line.

With reference to FIG. 2, the central casing 4 also comprises a vapor jet coater 7, preferably located on one side of the central casing parallel to the substrate path, beside the face of the substrate S which has to be coated. This coater is suited to spray a metal or metal alloy vapor onto the running substrate S. It can advantageously consist of an extraction chamber provided with a narrow vapor outlet orifice 71, the length of which is close to the width of the substrate to be coated.

The vapor outlet orifice 71 may have any suitable shape, such as a slot that can be adjusted lengthwise and widthwise for example. The possibility of adapting its length to the width of the substrate to be coated makes it possible to minimize the loss of evaporated metal.

The coater is preferably a sonic vapor jet coater, that is to say a coater capable of generating a vapor jet of sonic velocity. This type of coater is also usually referred to as a JVD (Jet Vapor Deposition) device. The reader may refer to the patent application WO97/47782 for a fuller description of one variant of this type of device. The coater can be coupled to any kind of metallic vapor generator, such as, for example, an induction-heated evaporation crucible or an electromagnetic levitation vapor generator.

Preferably, the central casing is surrounded by insulating panels themselves preferably surrounded by cooling panels. This allows reducing heat loss in the vacuum chamber 2 and improving the energy performance of the central casing.

Thanks to the design of the central casing, in particular the heating means and the vapor jet coater 7, metal or metal alloy vapor is ejected towards at least one side of the substrate and a first layer of metal or metal alloy is formed on that side by condensation of a first part of the ejected vapor, without condensation of vapor on the inner walls of the central casing.

The vacuum chamber 2 also comprises a vapor trap 8 in the form of an external casing located at the substrate exit 6 of the central casing 4, i.e. located downstream of the central casing in the running direction of the substrate.

Preferably, the vacuum chamber 2 also comprises a second vapor trap 8 in the form of an external casing located at the substrate entry 5 of the central casing 4, i.e. located upstream of the central casing in the running direction of the substrate.

Each vapor trap 8 is a box surrounding the substrate path on a given length in the running direction, typically 0.2 to 7 m long, for example between 0.5 time and 3.5 time the substrate width. Its walls delimit a cavity. It comprises an inward opening 9 and an outward opening 10 located on two opposite sides of the vapor trap and suited to let the substrate enter and exit the vapor trap. The inward opening 9 is adjacent to the central casing while the outward opening 10 is at the opposite.

The walls of the vapor traps 8 are suited to be thermally regulated. The heat regulation may be made by any suitable means, such as for example a cooling circuit supplied with a heat transfer fluid such as, for example, water or nitrogen. The heat regulation means are suited to maintain the inner walls of the vapor trap at a temperature low enough to favor condensation of metal or metal alloys vapors on the inner walls, typically below 100° C. Thanks to these heat regulation means, the metal or metal alloys vapors escaping the central casing are trapped and are not released in the vacuum chamber, which would, in that case, become clogged.

Thanks to the vapor trap 8, the part of the ejected vapor that did not condensate on the substrate in the central casing 4 and that exits the central casing is trapped in a cavity of small size compared to the cavity of the vacuum chamber 2, which ease the cleaning of the facility. Moreover, that part of the ejected vapor has some more time to condensate on the substrate in the form of a second layer of metal or metal alloy, which increases the deposition yield.

Each vapor trap 8 is in contact with the central casing 4. In particular, the inward opening 9 of the first vapor trap, respectively of the second vapor trap, is aligned with the substrate entry 5 of the central casing, respectively with the substrate exit 6 of the central casing, so as to form a passage linking the central casing to each vapor trap.

According to one variant of the invention, the vapor trap is of rectangular shape.

Preferably, the walls of the vapor trap around the inward opening are perpendicular to the substrate path P. Thanks to this position, these walls are as much distant as possible from the aperture 5, 6 of the central casing which reduces the risk of clogging of the aperture due to metal deposition on cold walls of the vapor trap located in the vicinity of the aperture. Thanks to this position, vapor entering the vapor trap also more preferably condensates on the substrate rather than on the walls, which further increase the deposition yield.

Preferably, the lower and upper walls of the vapor trap are converging outwards, i.e. the height of the outward wall is smaller than the height of the inward wall. Vapor is thus more efficiently trapped before it reaches the outward opening 10.

More preferably, the vapor trap 8 has, in longitudinal cross-section, a trapezoid shape pointing in a direction opposite to the central casing. In that configuration, the trapezium base line is positioned vertically and adjacent to the central casing. Thanks to this position of the base line, the walls of the vapor trap around the aperture of the central casing are as much distant as possible from the aperture which further reduces the risk of clogging of the aperture due to metal deposition on cold walls of the vapor trap located in the vicinity of the aperture. In that configuration, the edges of the trapezium outwards converge so as to trap as much vapor as possible before the vapor exits through the outward opening 10.

According to one variant of the invention, the inner walls of the vapor trap 8 are removable so that cleaning of the facility is further eased. Instead of stopping the deposition line during a long time to clean the facility, the clogged inner walls can be rapidly removed and replaced by cleaned inner walls.

Tests have been performed on the vacuum deposition facility to assess the efficiency of a facility comprising two vapor traps when evaporating zinc.

The quantity of zinc evaporated has been obtained by weighting the evaporation crucible, which feeds the vapor jet coater, before and after the test. The quantity of zinc deposited has been obtained by contacting the vapor traps with an acidic solution to dissolve zinc. The quantity dissolved was then measured by Inductively Coupled Plasma. The absence of zinc deposited in the vacuum chamber has been assessed visually.

A first trial done on a 500 mm-wide steel substrate, with a vapor outlet orifice 71 10 mm wider than the steel substrate on each side of the substrate, at a pressure of $10^{-1}$ mBar, has shown that 1.835 g of zinc had been deposited in the vapor traps for 13.5 Kg of zinc evaporated and that there was no zinc deposition in the vacuum chamber. This corresponds to a deposition yield of 99.99%.

A second trial done on a 300 mm-wide steel substrate, in less favorable conditions, i.e. with a vapor outlet orifice 50 mm wider than the steel substrate on each side of the substrate, at a pressure of $10^{-1}$ mBar, has shown that 4.915 g of zinc had been deposited at the inward opening 9 of the vapor traps for 10.5 Kg of zinc evaporated and that there was no zinc deposition in the vacuum chamber. This corresponds to a deposition yield of 99.95%.

In comparison, a test performed on a facility without vapor traps in the same conditions has shown a deposition yield of 99.5%. Despite this high figure, such a deposition yield would not be acceptable on an industrial line as this would lead to 6 Kg of zinc deposited per production hour, that is to say 2 tons of zinc deposited after a 2-week production campaign. This deposition yield corresponds to a build-up yield of 0.5%, which is 10 to 50 times higher than the build-up yield observed in the case of the invention.

The facility according to the invention applies more particularly, but not solely, to the treatment of metal strips, whether precoated or bare. Of course, the process according to the invention may be employed for any coated or uncoated substrate, such as for example aluminum strip, zinc strip, copper strip, glass strip or ceramic strip.

What is claimed is:

1. A vacuum deposition facility for continuously depositing, on a running substrate, coatings formed from metal or metal alloy, the facility comprising:
   a vacuum chamber, the vacuum chamber including:
      a central casing having a substrate entry and a substrate exit located on two opposite sides of the central casing and a vapor jet coater, inner walls of the central casing configured to be heated at a temperature above a condensation temperature of the metal or metal alloy vapors;
      a vapor trap in a form of an external casing located at the substrate exit of the central casing in direct contact with the central casing through one of outer walls of the central casing and one of outer walls of the vapor trap, the one of outer walls of the central casing and the one of outer walls of the vapor trap abutting each other and defining a common plane of contact between the central casing and the vapor trap, the vapor trap including an inward opening adjacent to the central casing and an outward opening, the inward opening and the outward opening located at opposite sides of the vapor trap, vapor trap inner walls configured to be maintained at a temperature below the condensation temperature of the metal or metal alloy vapors; and
      a the substrate path in the vacuum chamber through the central casing and the vapor trap.

2. The vacuum deposition facility as recited in claim 1, further comprising a second vapor trap located at the substrate entry of the central casing.

3. The vacuum deposition facility as recited in claim 1, wherein a length of the vapor trap in a running direction is between 0.5 times and 3.5 times of a width of the running substrate.

4. The vacuum deposition facility as recited in claim 1, wherein lower and upper walls of the vapor trap converge outwardly.

5. The vacuum deposition facility as recited in claim 1, wherein the vapor trap has, in longitudinal cross-section, a trapezoid shape pointing in a direction opposite to the central casing.

6. The vacuum deposition facility as recited in claim 5, wherein a base line of the trapezoid shape is positioned vertically and adjacent to the central casing.

7. The vacuum deposition facility as recited in claim 1, wherein the vapor trap inner walls are removable.

8. The vacuum deposition facility as recited in claim 1, wherein the vapor trap has a heat regulator including a cooling circuit supplied with a heat transfer fluid selected from the group consisting of water and nitrogen.

9. The vacuum deposition facility as recited in claim 1, wherein the vapor jet coater comprises an extraction chamber comprising a vapor outlet orifice having a length.

10. The vacuum deposition facility as recited in claim 1, wherein the vapor jet coater is a sonic vapor jet coater.

11. The vacuum deposition facility as recited in claim 1, wherein the vapor trap is a box.

12. The vacuum deposition facility as recited in claim 1, further comprising a metallic vapor generator coupled to the vapor jet coater.

13. The vacuum deposition facility as recited in claim 12, wherein the metallic vapor generator is an induction-heated evaporation crucible or an electromagnetic levitation vapor generator.

14. The vacuum deposition facility as recited in claim 1, wherein the vapor trap is of a rectangular shape.

15. The vacuum deposition facility as recited in claim 14, wherein the vapor trap inner walls are configured to be maintained at a temperature below 100° C.

16. The vacuum deposition facility as recited in claim 1, wherein the vapor jet coater is configured to spray metal or metal alloy vapors.

17. The vacuum deposition facility as recited in claim 16, wherein the vapor jet coater is configured to spray zinc vapors or zinc-magnesium alloy vapors.

18. The vacuum deposition facility as recited in claim 1, wherein the vapor trap is located downstream of the central casing in a running direction of the substrate.

19. The vacuum deposition facility as recited in claim 18, further comprising a second vapor trap located upstream of the central casing in the running direction of the substrate.

20. The vacuum deposition facility as recited in claim 1, further comprising the running substrate, wherein the substrate is a steel strip.

21. The vacuum deposition facility as recited in claim 1, wherein the vapor trap is configured to prevent metal or metal alloys vapors from being released in the vacuum chamber.

22. The vacuum deposition facility as recited in claim 21, wherein the vapor trap inner walls are configured to be maintained at a temperature below 100° C.

23. The vacuum deposition facility as recited in claim 1, wherein the vapor jet coater comprises a vapor outlet orifice having a length.

24. The vacuum deposition facility as recited in claim 1, wherein the length of the vapor outlet orifice is wider than a width of the running substrate.

25. The vacuum deposition facility as recited in claim 24, wherein the vapor outlet orifice is up to 50 mm wider than the width of the running substrate.

26. The vacuum deposition facility as recited in claim 24, wherein the vapor outlet orifice is 10 to 50 mm wider than the width of the running substrate.

27. The vacuum deposition facility as recited in claim 24, wherein the common plane of contact is perpendicular to the substrate path.

28. A vacuum deposition facility for continuously depositing, on a running substrate, coatings formed from metal or metal alloy, the facility comprising:
a vacuum chamber, the vacuum chamber including:
a central casing having a substrate entry and a substrate exit located on two opposite sides of the central casing and a vapor jet coater, inner walls of the central casing configured to be heated at a temperature above a condensation temperature of the metal or metal alloy vapors;
a vapor trap in a form of an external casing located at the substrate exit of the central casing in direct contact with the central casing through one of outer walls of the central casing and one of outer walls of the vapor trap, the one of outer walls of the central casing and the one of outer walls of the vapor trap abutting each other and defining a common plane of contact between the central casing and the vapor trap, the vapor trap including an inward opening adjacent to the central casing and an outward opening located at an opposite side of the vapor trap, wherein the inward opening is in one of vapor trap inner walls, and the vapor trap inner walls configured to be maintained at a temperature below the condensation temperature of the metal or metal alloy vapors; and
a substrate path in the vacuum chamber through the central casing and the vapor trap,
wherein the one of the vapor trap inner walls is perpendicular to the substrate path.

29. The vacuum deposition facility as recited in claim 28, wherein the vapor trap has, in longitudinal cross-section, a trapezoid shape pointing in a direction opposite to the central casing.

30. A kit for the assembling of a vacuum deposition facility for continuously depositing, on a running substrate, coatings formed from metal or metal alloy, the kit comprising:
a central casing including a substrate entry and a substrate exit located on two opposite sides of the central casing and including a vapor outlet orifice of a vapor jet coater, the inner walls of the central casing configured to be heated at a temperature above a condensation temperature of the metal or metal alloy vapors; and
a vapor trap in the form of an external casing configured to be located at the substrate exit of the central casing, the vapor trap including an inward opening and an outward opening located at an opposite sides of the vapor trap, vapor trap inner walls configured to be maintained at a temperature below the condensation temperature of the metal or metal alloy vapors;
the central casing and the vapor trap configured to be (i) in direct contact with the central casing through one of outer walls of the central casing and one of outer walls of the vapor trap, the one of outer walls of the central casing and the one of outer walls of the vapor trap configured to abut each other and define a common plane of contact between the central casing and the vapor trap and (ii) form a vacuum chamber comprising a substrate path through the central casing and the vapor trap.

31. The kit as recited in claim 30, wherein the common plane of contact is perpendicular to the substrate path.

32. A method for operating the vacuum deposition facility as recited in claim 1, the method comprising:
- ejecting, in a first step, metallic vapor towards at least one side of the running substrate, a first layer of metal or metal alloy being formed on the at least one side by condensation of a first part of the ejected vapor,
- the first step taking place in the central casing including the substrate entry and the substrate exit located on the two opposite sides of the central casing and including inner walls heated at the temperature above the condensation temperature of the metal or metal alloy vapors; and
- forming, in a second step, a second layer of the metal or metal alloy on the at least one side by condensation of a second part of the ejected vapor,
- the second step taking place in the vapor trap in the form of the external casing located at the substrate exit of the central casing and including the vapor trap inner walls maintained at the temperature below the condensation temperature of the metal or metal alloy vapors.

33. The method as recited in claim 32, wherein the second step takes place in a second vapor trap located at the substrate entry of the central casing.

\* \* \* \* \*